(12) United States Patent
Lenz

(10) Patent No.: US 7,397,248 B2
(45) Date of Patent: Jul. 8, 2008

(54) AMPLIFIER HAVING A REGULATION SYSTEM CONTROLLED BY THE OUTPUT STAGE

(75) Inventor: Helmut Lenz, Oberasbach (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 10/579,692

(22) PCT Filed: Nov. 9, 2004

(86) PCT No.: PCT/EP2004/052889

§ 371 (c)(1),
(2), (4) Date: May 16, 2006

(87) PCT Pub. No.: WO2005/050832

PCT Pub. Date: Jun. 2, 2005

(65) Prior Publication Data

US 2007/0075773 A1  Apr. 5, 2007

(30) Foreign Application Priority Data

Nov. 19, 2003  (DE) ............................... 103 53 965

(51) Int. Cl.
*G01V 3/00* (2006.01)
*H03F 3/38* (2006.01)
(52) U.S. Cl. .................... 324/322; 324/318; 330/10
(58) Field of Classification Search ......... 324/318–322; 330/10, 251
See application file for complete search history.

(56) References Cited

U.S. PATENT DOCUMENTS 2,922,947 A  *  1/1960  Bloom et al. ............... 324/322

5,262,733 A  11/1993  Nakajima et al.
5,559,467 A  9/1996  Smedley (Continued)

FOREIGN PATENT DOCUMENTS

WO  WO 03/055058  7/2003

(Continued)

OTHER PUBLICATIONS

The International Search Report (PCT/EP2004/052889).

(Continued)

*Primary Examiner*—Brij Shrivastav
*Assistant Examiner*—Tiffany A Fetzner
(74) *Attorney, Agent, or Firm*—Brinks Hofer Gilson & Lione

(57) ABSTRACT

An electrical amplifier comprising an output stage that can be supplied by an electrical energy source, is connected to a control device on the input side, the control signal of the control device controlling an output signal of the output stage dependent on a parameter value of the energy source. The amplifier is has a compensation device that is connected to the energy source and the control device, and is used to modify the control signal according to the parameter value of the energy source which can be, for example, the network voltage of the energy source. A method for controlling an electrical amplifier comprising an output stage supplied by an electrical energy source includes, determining parameter value of the energy source, deriving a compensation signal therefrom, and a control signal for the output stage is generated according to the compensation signal. The amplifier and method can be used in a gradient amplifier for a magnetic resonance appliance.

14 Claims, 4 Drawing Sheets

U.S. PATENT DOCUMENTS

| | | | |
|---|---|---|---|
| 6,124,757 A | 9/2000 | Newey | |
| 6,285,304 B1 * | 9/2001 | Schweighofer | 341/118 |
| 6,369,572 B1 * | 4/2002 | Van Groningen et al. | 324/322 |
| 6,400,158 B1 * | 6/2002 | Van Groningen et al. | 324/322 |
| 6,448,775 B1 * | 9/2002 | Lenz | 324/322 |
| 6,683,494 B2 * | 1/2004 | Stanley | 330/10 |
| 2002/0167354 A1 * | 11/2002 | Stanley | 330/10 |
| 2007/0075773 A1 * | 4/2007 | Lenz | 324/322 |
| 2008/0012636 A1 * | 1/2008 | Lenz | 330/96 |

FOREIGN PATENT DOCUMENTS

| | | |
|---|---|---|
| WO | WO 03/061117 | 7/2003 |

OTHER PUBLICATIONS

The International Preliminary Examination Report (IPER) with English Translation and Amended Sheets.

Hancock, John, A Class D Amplifier Using MOSFETs with Reduced Minority Carrier Lifetime, J. Audio Eng. Soc., vol. 39, No. 9, Sep. 1991, Santa Clara, CA, pp. 650-662.

Watanabe et al., DSP-Based High Precision Current Tracking Control of Gradient Coil in Two-Paralleled PWM Amplifiers for MRI Systems, IEEE 1998, pp. 916-921.

* cited by examiner

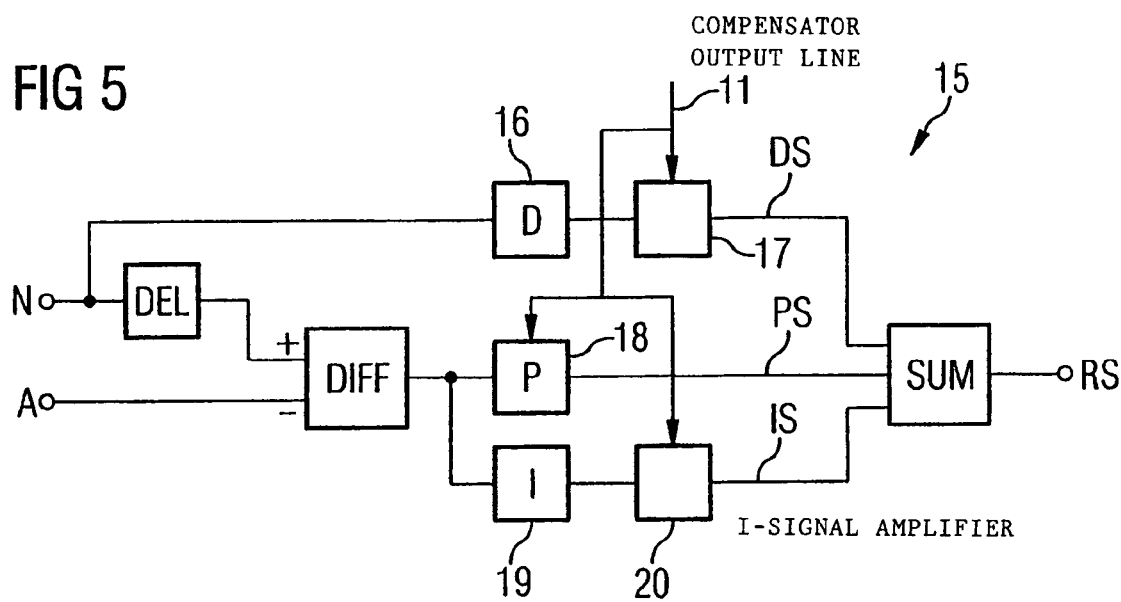
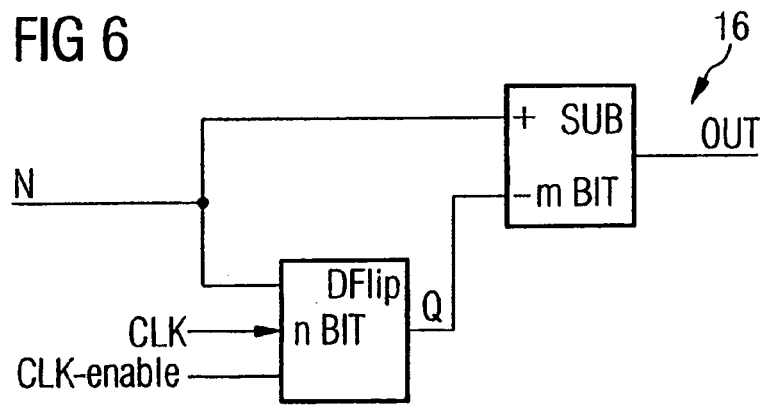
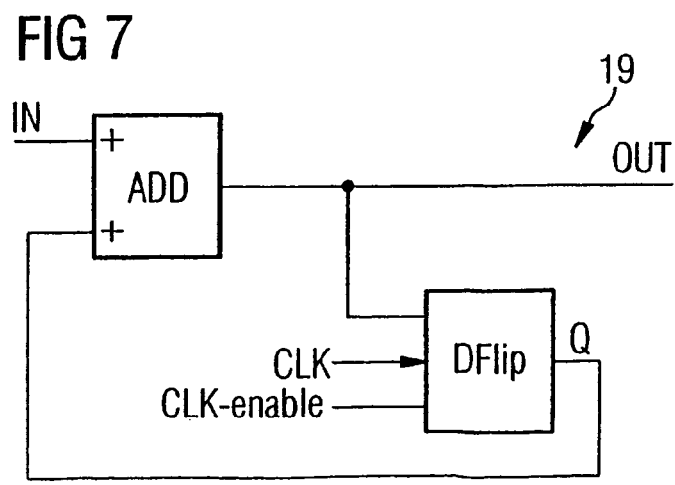

AMPLIFIER HAVING A REGULATION SYSTEM CONTROLLED BY THE OUTPUT STAGE

TECHNICAL FIELD

This application relates to an amplifier with output-stage-controlled regulation and to a method for output-stage-controlled regulation of an amplifier.

BACKGROUND

Often, electrical amplifiers have a two-stage construction. In a first stage, an intermediate circuit generator or a power supply unit generates a supply voltage of medium amplitude or precision. The supply voltage and intermediate circuit generator supply an output stage for generating an output signal with the desired properties. Depending on requirements, the output signal may have a voltage that is transformed upward compared to the supply voltage and, may have predeterminable constant or time-dependent signal properties. For use as a gradient amplifier for gradient coils in magnetic resonance systems, especially fast-time dependent output signal properties that must be adhered to precisely must be assured.

The precision with which the desired parameter values of the output signal, such as current or voltage, can be adhered to depends, among other factors, on fluctuations in the power supply voltage. Under some circumstances, fluctuations in the power supply voltage can be partly compensated for by circuitry of the output stage. However, complete compensation is not always possible, and hence not all the requirements made of the output signal can readily be met.

With a view to the quality of the output signal, a stabilized power supply unit is employed. In addition, the desired parameters of the output signal can be regulated, and the regulator, for instance, regulates switching times of switch elements of the output stage. Such regulation can be adapted optimally to the desired mode of operation of the output stage, so as to minimize the effects of a fluctuating supply voltage. Nevertheless, at critical operating points, for instance when the time-dependent properties of the output signal are changing rapidly, an influence of the power supply signal remains. Depending on the output signal requirements, additional compensation for supply fluctuations can therefore be desirable.

SUMMARY

An amplifier having an output stage which can be supplied by an electrical energy source, the output stage having an input from a control device for controlling an output signal is described. Compensation for fluctuations in the energy source is provided by a compensation device which is connected to the energy source and to the control device, and by which a control signal is variable as a function of the value of the parameter. An output stage may also comprise a plurality of series-connected individual output stages which are supplied from potential-free energy sources.

Fluctuations in the energy source may be detected as they occur and before an output signal is generated. The effect of the fluctuations on the output stage performance is taken into account in the control signal for the output stage, and therefore compensated for in advance, or proactively. Therefore, fluctuations at critical operating points, for instance when rapid changes in the output signal are occurring, which are often associated with an overshoot because of the control of output stage, may be suppressed, without additional sources of error, such as the overshoot affecting the compensation. Thus, the compensation is effected in a way that is directly dependent on the signal to be compensated for and independently of other, unwanted, influencing variables. In another aspect, a regulation system is provided which is connected on the input side to the output stage and the output side to the control device, and by whose regulator signal the control signal can be regulated as a function of the output signal of the output stage. The regulation system is connected to the compensation device, and by means of the compensation device, the regulator signal is variable as a function of the value of the parameter of the energy source.

As a result, the output signal of the output stage can initially be regulated as stably as possible by the regulation system, and the compensation device accomplishes an additional stabilization. Combining the two devices brings about stabilization of the output signal. In a further aspect, the compensation device is embodied to generate a compensation signal that is dependent on the parameter and on a nominal or maximal value of the parameter. As a result, an operating range for the compensation signal is predetermined such that an operating range adapts to that of the desired signal of the energy source. As a result, for different nominal or maximal values of the energy source, an overshoot from variations in the compensation signal can be avoided.

A method for controlling an amplifier having an output stage which is supplied by an electrical energy source, includes: providing an output stage connectable to an energy source; ascertaining a parameter value of the energy source (a first parameter value); generating a compensation signal as a function of the first parameter value; generating a control signal as a function of the compensation signal; and generating an output signal as a function of the control signal.

Fluctuations in the energy source can be directly detected and used for compensation. As a result, other indirect influencing variables, which may be due to the control or mode of operation of the output stage, may not have an effect on the compensation and the compensation of the output stage is directly dependent on the energy source.

In a further aspect, the method includes: ascertaining a parameter value (a second parameter value) of the output signal; generating a regulator signal as a function of the second parameter; and, generating the control signal as an additional function of the regulator signal.

The combination of the method steps for direct compensation of fluctuations in the energy source and for regulating the output signal of the output stage may further stabilize the amplifier output signal.

The amplifier and the method, as a function of, for example, an energy source supply voltage, can generate an amplifier output voltage which is stabilized by the compensation device. The regulation system can also regulate the output voltage on the basis, for example, of the current induced in a coil by the output stage.

The supply-voltage-dependent, output-current-regulated amplification may be employed in a gradient amplifier for a gradient coil in a magnetic resonance system, where a coil current changes rapidly with time, in order to generate rapidly changing magnetic gradient fields.

BRIEF DESCRIPTION OF THE DRAWINGS

FIG. 5 is a block diagram of a PI regulator with D control and controllable regulation parameters;

FIG. 6 is a simplified schematic diagram of a D regulating element; and

FIG. 7 is a simplified block diagram of an I regulating element.

DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Figure 1:
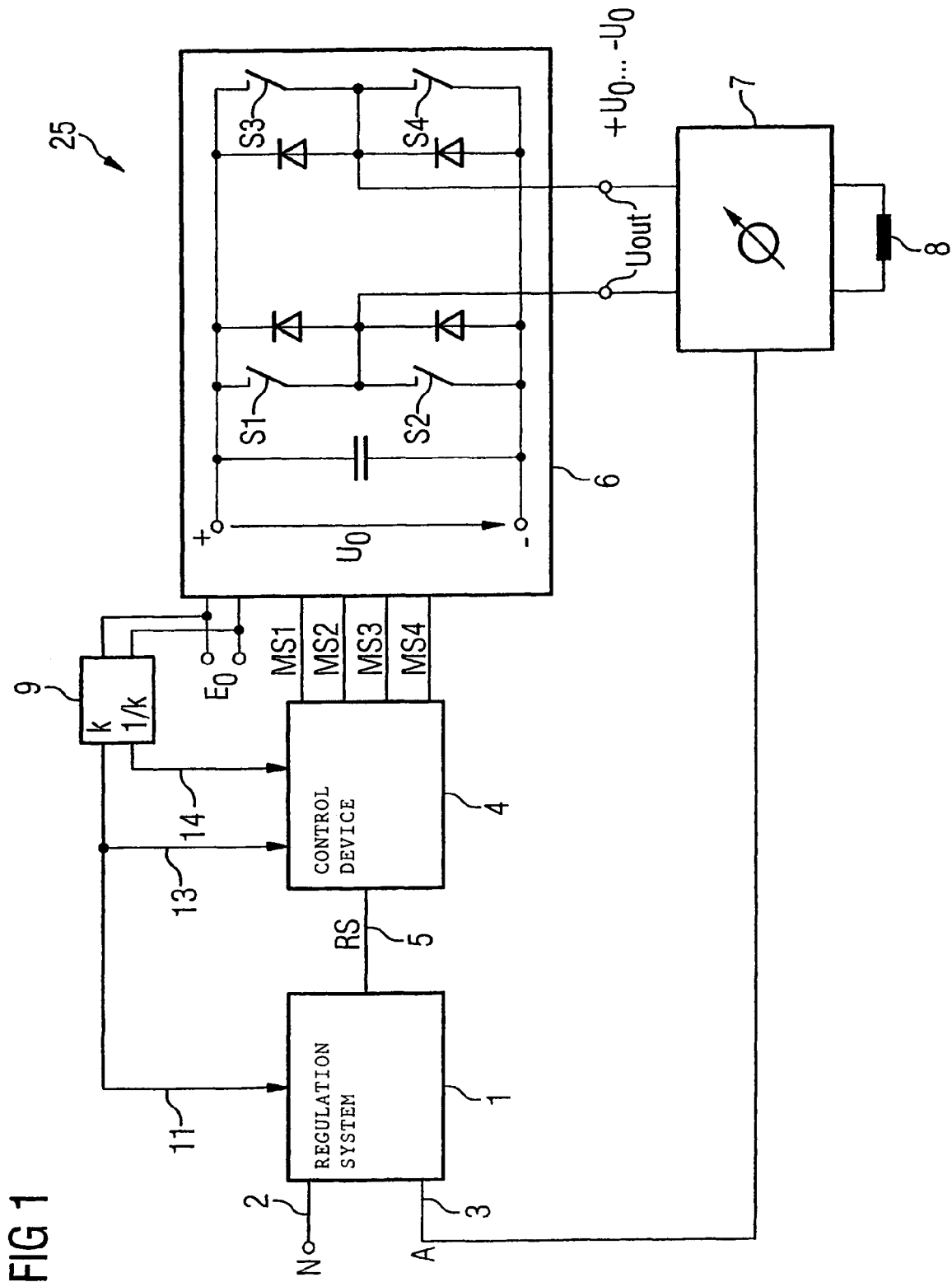
FIG. 1 illustrates a regulated two-stage amplifier with a compensation device.

FIG. 1 schematically shows a regulated two-stage amplifier 25 with a compensation device 9. The amplifier 25 has an electrical energy supply $E_0$, which supplies an output stage 6. The output stage 6 generates an output signal $U_{out}$, which is used to drive a load 8, shown here as a coil.

A parameter value of the output signal $U_{out}$ is ascertained by a measuring device 7 and applied to a regulation system 1 by a connection line 3. The value is noted in the drawing by the letter A for "actual". As a further signal input, the regulation system 1 has a nominal value line 2, which is noted in the drawing by the letter N for "nominal". The regulator signal RS is delivered to the control device 4 via a regulator output line 5, and the control device is connected to the output stage 6 via four signal lines (or correspondingly more in the event of a series circuit of multiple output stages) for the control signals MS1 through $MS_4$.

The output stage 6 has a circuit arrangement with a smoothing capacitor, not identified by reference numeral, and four switches $S_1$ through $S_4$ and free-wheeling diodes, not identified by reference numeral, connected in parallel to the switches. The switches $S_1$ through $S_4$ are operated by the control signals $MS_1$ through $MS_4$. As a result, an output voltage of the output stage 6 can be generated whose value, averaged over one switching period, can lie between the positive power supply voltage $+U_0$ and the negative power supply voltage $-U_0$.

The power supply voltage $U_0$ is made available by an energy supply $E_0$ and is therefore subject to fluctuations in the energy supply. As a consequence, the output signal $U_{out}$ of the output stage 6 may also be subject to these fluctuations.

To compensate for these fluctuations, a compensation device 9 is provided. The compensation device 9 generates a compensation factor k, or its reciprocal value 1/k as an output signal. The compensation factor k depends, on a parameter value of the energy supply $E_0$. The factor k is delivered to the regulation system 1 or the control device 4 via the compensator output lines 11 or 13, or the reciprocal value 1/k is delivered to the control device 4 via the compensator output line 14. The compensator output lines 11, 13, 14 are redundant in the sense that only one of the three compensator output lines 11, 13, 14 is needed by the compensation device 9. In this sense, the lines can be understood as alternatives to one another.

The amplifier 25 shown may generate an output voltage $U_{out}$ which may be, for instance, a function of a supply voltage $U_0$, and be stabilized by the compensation device 9. In this aspect, the compensation device 9, ascertains the supply voltage $U_0$ as a parameter of the energy supply $E_0$. By measuring the output stage supply voltage $U_0$, the voltage excursions of the output stage, which may occur from a change in the load on the output stage, may be compensated for as well. Moreover, the measuring device 7 may be a current measuring device, which measures the current induced in the coil 8 by the output voltage $U_{out}$ of the output stage 6. Such a voltage-dependent, current-regulated amplifier 25 may be used, for instance, as a gradient amplifier in a magnetic resonance system, where rapid time-dependent changes in the coil current, or gradients, must be generated in order to produce rapidly changing magnetic gradient fields.

Figure 2:
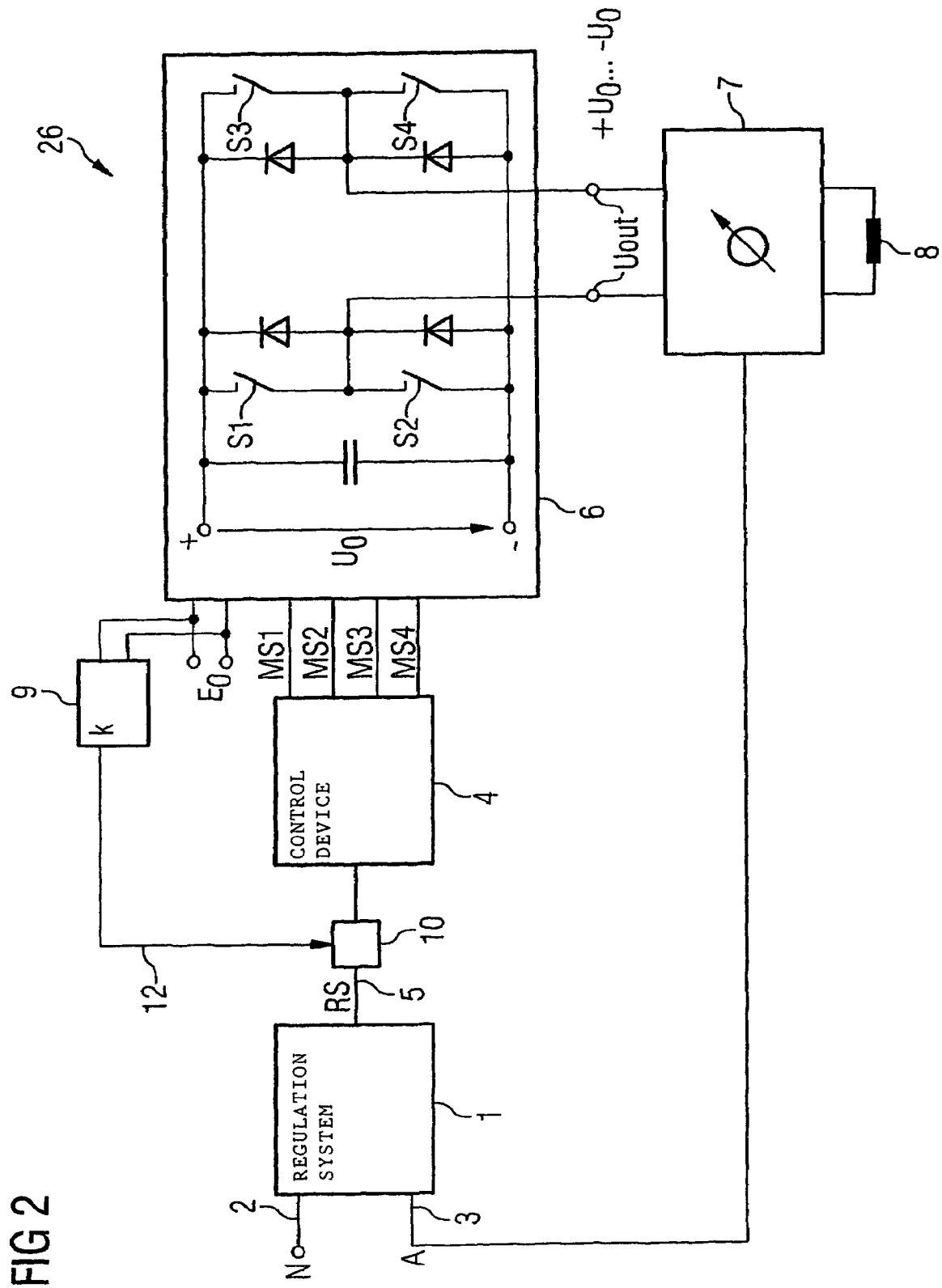
FIG. 2 illustrates a regulated two-stage amplifier with a compensation device and a regulator signal amplification device.

In another aspect, FIG. 2 shows an amplifier 26 with a modified compensation device 9. The output stage 6 with the regulation system 1 and the control device 4 correspond to the previous descriptions above and are identified by the same reference numerals. The compensation device 9, as described above, generates a compensation factor k as a function of a parameter value of the energy supply $E_0$. The compensation factor k is delivered to a regulator signal amplification device 10 via the compensator output line 12. The regulator signal amplification device 10 is connected on the input side to the regulator output line 5, and the amplification device 10 amplifies the regulator signal RS as a function of the compensation factor k. In this way, the compensation device 9 acts on the controller of the output stage 6.

Figure 3:
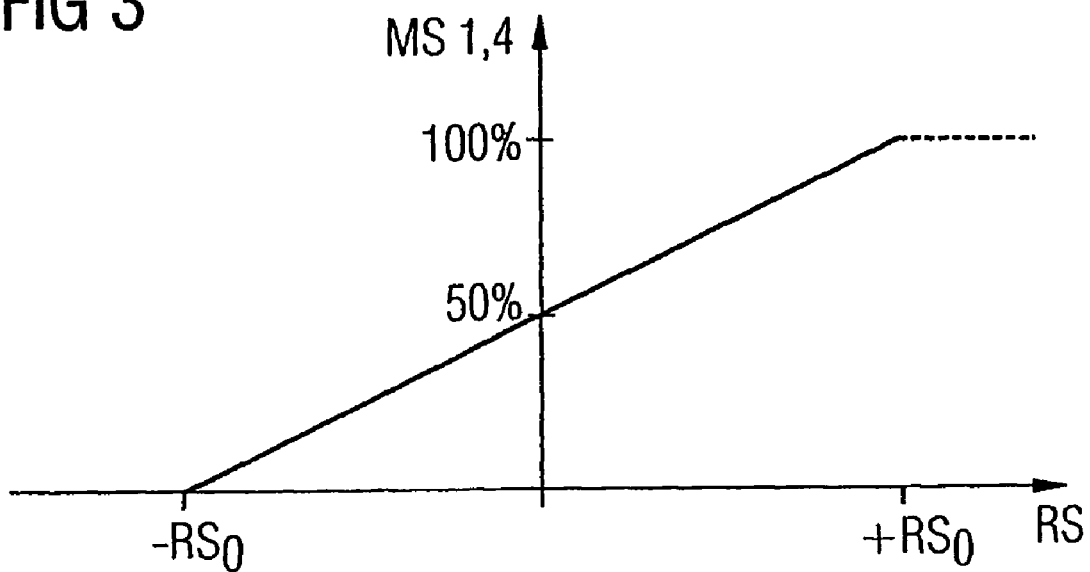
FIG. 3 shows the relationship of the control signal of the output stage to the regulator signal.

In FIG. 3, control signals $MS_1$ and $MS_4$ are shown as a function of the regulator signal RS. The regulator signal RS may assume values within an arbitrarily defined signal range from $-RS_0$ to $+RS_0$. The control device 4 may be an analog or digital modulator, which via the signals $MS_1$ through $MS_4$ triggers the switches $S_1$ through $S_4$ of the output stage 6, for instance in such a way that the switches $S_4$ and $S_4$ are opened or closed simultaneously, as are the switches $S_2$ and $S_3$.

In an analog modulator, the regulator signal RS is typically a voltage, which is compared in the modulator with a triangular voltage as a comparison variable. If RS is greater than the instantaneous value of the triangular voltage, then the signals $MS_1$ and $MS_4$, for instance, can be set for closing the switches $S_1$ and $S_4$. Conversely, if RS is less than the instantaneous value of the triangular voltage, then $MS_2$ and $MS_3$ can instead be set, so that the switches $S_2$ and $S_3$ are instead closed. In a digital modulator, the comparison variable may be a counter state. If the regulator signal RS, present in the form of a digital number, is greater than the counter state, then $MS_1$ and $MS_4$ may be set, for instance, while conversely if RS is less than the counter state, then $MS_2$ and $MS_3$ may be set instead.

If the switches $S_1$ and $S_4$ are closed and $S_2$ and $S_3$ are open, then the resultant output voltage $U_{out}$ is the voltage $+U_0$; conversely, if $S_2$ and $S_3$ are closed and $S_1$ and $S_4$ are open, then the resultant output voltage $U_{out}$ is the voltage $-U_0$. If the switches are opened and closed in alternation, the result, as an average value of the output voltage $U_{out}$, is a voltage which is between $+U_0$ and $-U_0$ and which depends on the switching times of the switches $S_1$ through $S_4$.

For instance, at $-RS_0$, the signals $MS_1$ and $MS_4$ are not set, and the signals $MS_2$ and $MS_3$ are set. As the regulator signal RS linearly increases, the signals $MS_1$ and $MS_4$ as well as $MS_2$ and $MS_3$ are set and opened in alternation with modified switching times. For a regulator signal of 0, the switching times for $S_1$ and $S_4$, and $S_2$ and $S_3$, are of equal length, and at a regulator signal of $+RS_0$, only the signals $MS_1$ and $MS_4$ are set, while $MS_2$ and $MS_3$ are not set.

Figure 4:
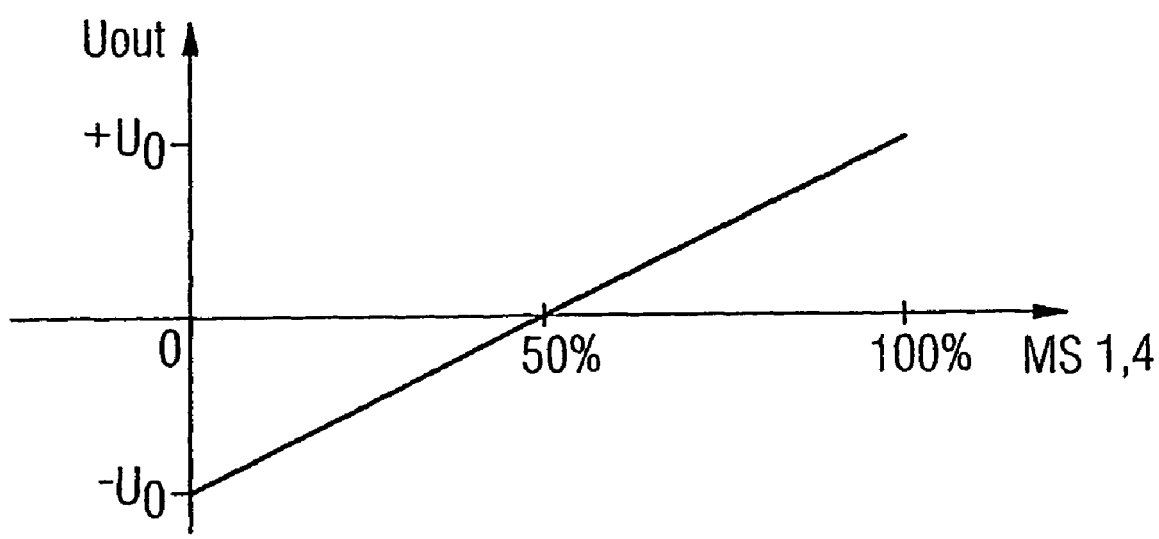
FIG. 4 shows the relationship of the output signal of the output stage to the control signal.

In FIG. 4, the output signal of the output stage $U_{out}$ is shown as a function of control signals $MS_1$ through $MS_4$. Based on the output signal $-U_0$ with the signal for $MS_1$ and MS$_4$ not set (and MS$_2$, MS$_3$ are set at 100%). The output signal is zero, when the switching times for MS$_1$ and MS$_4$, and MS$_2$ and MS$_3$, are of equal length. If the switching times shift further, such that only MS$_1$ and MS$_4$ are set, then the output signal rises further linearly, until the maximum value of +U$_0$ for the output signal U$_{out}$, of the output stage 6 is reached.

Together with the above description of the drawings, for the range of the regulator signal RS of from −RS0 to +RS0, a regulating range for the output signal U$_{out}$ of from −U$_0$ to +U$_0$ thus results.

For the relationship among the control signals MS$_1$ through MS$_4$ and the regulator signal RS, the following equation applies:

$$MS_{2,3}=100\%-MS_{1,4};$$

in this illustration, the control signals MS$_1$ through MS$_4$ are understood as a percentage of the time during which the respective control signal is set. In other words, at the value of 100%, for instance, MS$_1$ and MS$_4$ are constantly set, while at the value of 75%, for instance, they are set 75% of the time. If the regulator signal RS is added, then for the relationship between the control signals MS$_{1,4}$ and the regulator signal RS, the following equation applies:

$$MS_{1,4}=50\%+RS*50\%/RS_0.$$

For the relationship between the control signals MS1,4 and the output signal U$_{out}$ of the output stage 6, the following equation applies:

$$U_{out}=(U_0/50\%)*MS_{1,2}-U_0.$$

The amplification of the output stage 6 is obtained by inserting the above relationship for MS$_{1,4}$ into the preceding relationship for U$_{out}$:

$$U_{out}=(U_0/50\%)*(50\%+RS*50\%/RS_0)-U_0,$$

and from the above, by simplification:

$$U_{out}=U_0*RS/RS_0.$$

As a result, for the amplification V of the chain comprising the control device 4 and the output stage 6, the following equation is obtained:

$$V=U_0/RS=U_{out}/RS_0.$$

The output signal U$_{out}$ of the output stage 6 is thus linearly dependent on the regulator signal RS. However, there is also a dependency on the supply voltage U$_0$. In the event of a supply voltage U$_0$ that is not stabilized or is only insufficiently stabilized, for instance if fluctuations occur in the mains voltage or in the event of a rapidly varying load, an influence on the regulation properties may become apparent. This approach may be used with other modulation methods where a modulation method is intended is to achieve a linear relationship between the output signal of an output stage and its regulator signal.

From the preceding equation, it can be seen that compensation for fluctuations in the supply voltage U$_0$ is possible by a compensation factor k, for which the following applies:

$$k=U_N/U_0,$$

where U$_N$ represents a nominal or typical supply voltage, for instance the maximum supply voltage. For compensation, either the regulator signal RS is multiplied by the compensation factor k, or the range of the regulator signal is increased by factor 1/k, so that the range limits are at RS$_0$*1/k.

From the above-described FIGS. 1 and 2, it can be seen that the compensation factor k, or its reciprocal 1/k, is delivered to either the regulation system 1, the control device 4, or the regulator signal amplification device 10.

In FIG. 5, as an example of a regulator included in FIG. 1, a PID controller with D control and adjustable controller parameters is shown. The nominal value N is delivered to a branch that has the D element 16, and the amplification of the D element 16 is adjustable by the D-signal amplifier 17. The D-signal amplifier 17, as its input signal, receives the compensation factor k, or a value proportional to the compensation factor k, via the compensator output line 11. The amplified output signal of the D element 16, DS, is delivered to an adder.

The nominal value N is also delivered to a delay element DEL (delay), and from there it is delivered to a differentiator (DIFF). The differentiator DIFF receives the actual value A as its input signal and forms a control signal as the difference between the nominal value N and the actual value A. The control signal is delivered both to the adjustable P element 18 and to the I element 19 and from there to the I-signal amplifier 20. The adjustment of the P element 18 and of the I-signal amplifier 20 is also effected by the compensator output line 11, by way of which the compensation factor k or a value proportional thereto is delivered. The P-signal PS and the I-signal IS, like the D-signal DS, are delivered to the adder SUM, which produces the regulator signal RS. The digital and adjustable PID controller 15 may be used as a regulation system in the amplifier of FIG. 1 or FIG. 2.

The amplifiers 17, 18 and 20 for adjusting the control parameters "P", "I" and "D" can be used for adjusting the compensation factor as well, and the amplifier device 10 may be omitted.

In an aspect, FIG. 6 shows a digital construction for the D element 16 is shown. The nominal value N is delivered to an n-bit-wide memory, a D flip-flop D$_{Flip}$, and to an m-wide subtractor SUB. In this example, let m=n+1. D$_{Flip}$ is clocked by the clock signal CLK, and the clock rate can be lowered by the signal CLK-$_{enable}$, for instance if CLK is a high-speed system clock signal.

The rise response of the digital D element, with the condition that m=n +1, may shown in tabular form as follows, for example:

| | Takt = "Clock signal". | | | | | | | | | | | | | | | |
|---|---|---|---|---|---|---|---|---|---|---|---|---|---|---|---|---|
| | Takt | | | | | | | | | | | | | | | |
| | 1 | 2 | 3 | 4 | 5 | 6 | 7 | 8 | 9 | 10 | 11 | 12 | 13 | 14 | 15 | 16 |
| N | 0 | 0 | 2 | 4 | 6 | 8 | 8 | 8 | 8 | 8 | 6 | 4 | 2 | 0 | 0 | 0 |
| Q | | 0 | 0 | 2 | 4 | 6 | 8 | 8 | 8 | 8 | 8 | 6 | 4 | 2 | 0 | 0 |
| Out | | 0 | 2 | 2 | 2 | 2 | 0 | 0 | 0 | 0 | −2 | −2 | −2 | −2 | 0 | 0 |

In FIG. 7, a digital design of the I element 19 is shown. The input signal IN which, in a PID controller, is the control difference signal, is delivered to an adder ADD. The output signal of ADD is delivered to a D flip-flop $D_{Flip}$, which is clocked by a clock signal CLK and can be lowered in its clock rate by the signal CLK-$_{enable}$. The output signal Q of $D_{Flip}$ is delivered to a further input of ADD. Thus the output signal of the adder ADD is at the same time the input signal of the amplifier 20. Alternatively, as the output, the output Q of $D_{Flip}$ can be used, which in comparison to the output of ADD appears later by one clock signal. The response of the I element described can for instance have the following characteristics, assuming as a starting condition Q=0:

Takt = "Clock signal".

| | Takt | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| N | 0 | 0 | 0 | 1 | 1 | 1 | 1 | 1 | 1 | 1 | 1 | 1 | 1 | 1 | 1 | 1 |
| Q | 0 | 0 | 0 | 0 | 1 | 2 | 3 | 4 | 5 | 6 | 7 | 8 | 9 | 10 | 11 | 12 |
| Out | 0 | 0 | 0 | 1 | 2 | 3 | 4 | 5 | 6 | 7 | 8 | 9 | 10 | 11 | 12 | 13 |

An analog integrator, with a time constant corresponding to a clock signal length and an input voltage having the above-indicated time pattern, varies from zero to 1V, at a starting condition of 0V, would have an output voltage which varies by 1V per clock signal length, as in the above-indicated time pattern. As can be seen from these two examples, both analog and correspondingly constructed digital regulator circuits are substantially equivalent in their functional principle and performance.

If the compensation is to be performed by the compensation factor k, or its reciprocal, in the control device 4 then, with a digital control device which has one or more analog-to-digital converters for converting an analog regulator signal RS, the multiplication of the regulator signal RS by the compensation factor k is performed in the analog-to-digital conversion process. The external reference input of one of the analog-to-digital converters is used for the standard of the conversion in accordance with 1/k. For a fully digital control device 4, the digital regulator signal RS can be multiplied by the compensation factor k. Alternatively, in an analog control device 4, the comparison variable (triangular voltage) may be multiplied by the reciprocal of the compensation factor; that is, 1/k. The compensator output line 14 described in conjunction with FIG. 1 may be used.

Limit values maybe specified for the compensation factor k. For instance, if the supply voltage $U_0$ tends toward zero, then the compensation factor k would tend toward infinity. Useful operation of the amplifier, however, is not possible at extremely low supply voltages $U_0$. A practical design could therefore be limited to supply voltages $U_0$ that, at maximum, are approximately 30% below the rated value of the supply voltage $U_0$ or approximately 40% above the maximum value of the supply voltage. For supply voltages $U_0$ outside these limit values, the compensation factor k could then be kept constant.

In the description of the relationship between the output voltage of the output stage and the regulator signal, a linear relationship has been assumed as an idealized form. Even if this ideal relationship does not in fact exist, for instance because of safety margins in the triggering of the output stage switches to avoid short-circuit triggering, the restriction to a useful operating range means that adequate precision of the compensation can still be achieved. Alternatively, the nonlinearities can be taken into account in ascertaining k.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

The invention claimed is:

1. A gradient amplifier of a gradient coil within a Magnetic Resonance Imaging system, comprising:
   an output stage adapted to connect to an electrical energy source;
   a compensation device adapted to connect to the electrical energy source and to measure a first parameter value and to output at least one compensation signal;
   a control device,
   wherein the control device accepts at least one compensation signal as an input, and controls the output stage by a control signal output; and
   wherein the output stage of the gradient amplifier permits supply-voltage-dependent, output-current-regulated amplification by the gradient amplifier of the Magnetic Resonance Imaging system gradient coil within the magnetic resonance system.

2. The amplifier of claim 1, further comprising:
   a regulation system connected on an input side to the output stage and on an output side to the control device and configured to produce a regulator signal (RS);
   wherein the regulator signal (RS) is a function of a second parameter value of the output stage.

3. The amplifier of claim 1, wherein the energy source is a voltage source, and the first parameter is the input supply voltage.

4. The amplifier as in claim 1, wherein the amplifier is a pulse width modulator.

5. The amplifier of claim 1, wherein the compensation device generates a compensation signal that is dependent on the first parameter value and on one of a nominal or a maximal value of the first parameter value.

6. The amplifier of claim 1, wherein the compensation device is connected on the output side to at least one of the control device or to the regulation system.

7. The amplifier of claim 2 further comprising:
   a regulator signal amplification device connected to the regulation system, wherein the compensation device is connected on the output side thereof to an input of the regulator signal amplification device.

8. The amplifier of claim 3, wherein the regulator system accepts at least one compensation signal and the regulator signal (RS) is variable as a function of the first parameter value.

9. The amplifier of claim 1, wherein the energy source is a voltage source; and that the first parameter is an output supply voltage.

10. The amplifier of claim 2, wherein the second parameter value is at least one of an amplifier output voltage or a load current.

11. A magnetic resonance system having gradient amplifier and a gradient coil, comprising:
an output stage adapted to connect to an electrical energy source;
a compensation device adapted to connect to the electrical energy source and to measure a first parameter value and to output at least one compensation signal;
a control device, wherein the control device accepts at least one compensation signal as an input, and controls the output stage by a control signal output; and
wherein the output stage of the gradient amplifier permits supply-voltage-dependent, output-current-regulated amplification by the gradient amplifier of the gradient coil in the magnetic resonance system.

12. A method of controlling a gradient amplifier of a gradient coil within a Magnetic Resonance system, having an output stage which is supplied by an electrical energy source, the method comprising:
ascertaining a first parameter value of the energy source;
generating a compensation signal as a function of the first parameter value;
generating a control signal as a function of the compensation signal, wherein the output stage generates an output signal as a function of the control signal; and
wherein the method of controlling the output stage of the gradient amplifier permits supply-voltage-dependent, output-current-regulated amplification by the gradient amplifier of the gradient coil in the magnetic resonance system.

13. The method as defined by claim 12, further comprising: ascertaining a second parameter value of the output signal; generating a regulator signal as a function of the second parameter value; and modifying the control signal as function of the regulator signal.

14. The amplifier of claim 13, wherein the second parameter value is at least one of an amplifier output voltage or a load current.

* * * * *

UNITED STATES PATENT AND TRADEMARK OFFICE
CERTIFICATE OF CORRECTION

PATENT NO. : 7,397,248 B2
APPLICATION NO. : 10/579692
DATED : July 8, 2008
INVENTOR(S) : Helmut Lenz It is certified that error appears in the above-identified patent and that said Letters Patent is hereby corrected as shown below:

<u>On the Title Page</u>

In column 2, line 6, under "ABSTRACT", before "has a compensation device" delete "is".

<u>In the Claims</u>

In column 9, in claim 11, line 14, after "resonance system having" insert --a--.

Signed and Sealed this

Twenty-third Day of December, 2008

JON W. DUDAS
*Director of the United States Patent and Trademark Office*